(12) United States Patent
Matsuura et al.

(10) Patent No.: US 12,170,198 B2
(45) Date of Patent: Dec. 17, 2024

(54) DEPOSITION METHOD AND PLASMA PROCESSING APPARATUS

(71) Applicant: Tokyo Electron Limited, Tokyo (JP)

(72) Inventors: Hiroyuki Matsuura, Iwate (JP); Jinseok Kim, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 544 days.

(21) Appl. No.: 17/456,680

(22) Filed: Nov. 29, 2021

(65) Prior Publication Data

US 2022/0223403 A1 Jul. 14, 2022

(30) Foreign Application Priority Data

Jan. 12, 2021 (JP) .................................. 2021-002978

(51) Int. Cl.
| | |
|---|---|
| C23C 16/00 | (2006.01) |
| C23C 16/34 | (2006.01) |
| C23C 16/455 | (2006.01) |
| C23C 16/52 | (2006.01) |
| H01J 37/32 | (2006.01) |
| H01L 21/02 | (2006.01) |

(52) U.S. Cl.
CPC ........ *H01L 21/0228* (2013.01); *C23C 16/345* (2013.01); *C23C 16/45536* (2013.01); *C23C 16/45538* (2013.01); *C23C 16/45544* (2013.01); *C23C 16/52* (2013.01); *H01J 37/32449* (2013.01); *H01L 21/0217* (2013.01); *H01L 21/02274* (2013.01); *H01J 2237/332* (2013.01)

(58) Field of Classification Search
CPC ............ H01L 21/0228; H01L 21/0217; H01L 21/02274; C23C 16/345; C23C 16/45536; C23C 16/45544; C23C 16/52; C23C 16/45538; H01J 2237/332; H01J 37/3244
See application file for complete search history.

(56) References Cited

U.S. PATENT DOCUMENTS

| | | | |
|---|---|---|---|
| 2008/0260969 A1* | 10/2008 | Dussarrat ............. | C23C 16/345 427/255.394 |
| 2009/0191722 A1* | 7/2009 | Hasebe ............. | H01L 21/02274 257/E21.24 |
| 2009/0308840 A1* | 12/2009 | Kohno ............. | H01L 21/02211 216/37 |
| 2012/0213940 A1* | 8/2012 | Mallick ............... | H01L 21/0217 427/535 |
| 2016/0293398 A1* | 10/2016 | Danek ............... | H01L 21/02211 |

FOREIGN PATENT DOCUMENTS

JP 2006-270016 10/2006

* cited by examiner

*Primary Examiner* — Luz L Alejandro Mulero
(74) *Attorney, Agent, or Firm* — IPUSA, PLLC

(57) ABSTRACT

A deposition method of depositing a silicon nitride film on a surface of a substrate includes: (a) exposing the substrate to a plasma formed from a nitriding gas containing nitrogen (N) and hydrogen (H); (b) exposing the substrate to a plasma formed from hydrogen ($H_2$) gas; (c) exposing the substrate to a plasma formed from a process gas containing a halogen; (d) supplying trisilylamine (TSA) to the substrate; and (e) repeating (a) to (d) in this order.

5 Claims, 22 Drawing Sheets

FIG.10

|  | FIRST REACTION PATH | | SECOND REACTION PATH |
|---|---|---|---|
| PHYSICAL ADSORPTION ENERGY | $E_p(N-H) = -0.186$ eV | < | $E_p(H-H) = -0.041$ eV |
| ACTIVATION ENERGY | $E_{a1}$ | < | $E_{a2}$ |

Dehydrogenation from –NH$_2$ $E_a(H-NH_2) = 0.374$ eV

IS　　FS
$\Delta E = -0.31$ eV

Dehydrogenation from –NH $E_a(H-NH) = 0.340$ eV

IS　　FS
$\Delta E = -0.448$ eV

−NHCl generation

−NH surface
IS

ΔE = −2.489 eV
FS

−NCl generation

−N surface
IS

ΔE = −2.659 eV
FS

−NCl$_2$ generation

−NCl surface
IS

ΔE = −1.964 eV
FS

−NHCl generation $E_{a6} = 2.075$ eV

IS

FS
$\Delta E = 0.3$ eV

−NCl$_2$ generation $E_{a7} = 1.94$ eV

IS

FS
$\Delta E = 0.012$ eV

Silylation

Dehydrogenation (-SiH$_2$NH(SiH$_3$)$_2$ deposition)

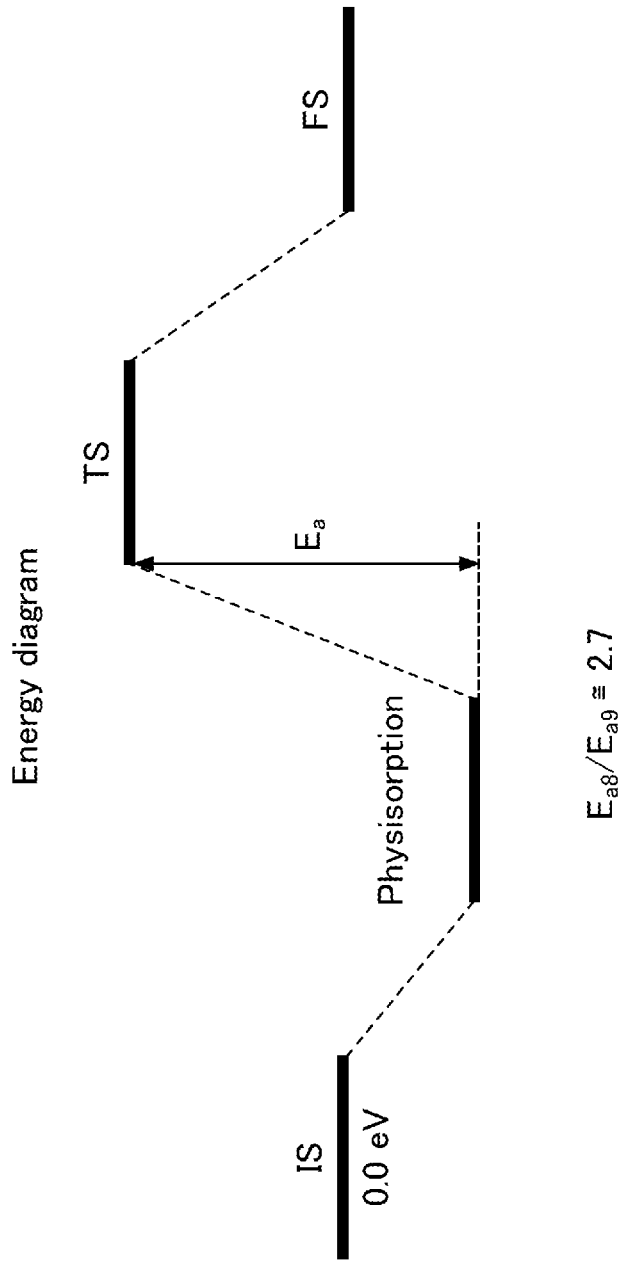

Silylation

Dehydrogention (-SiH$_2$NH(SiH$_3$))$_2$ deposition)

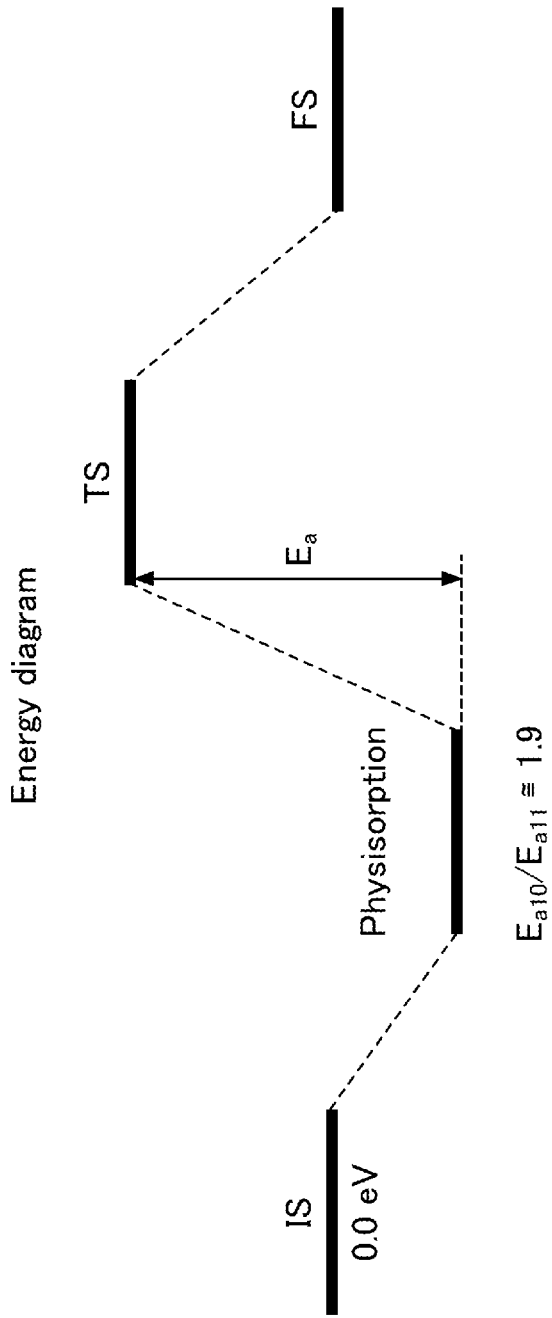

TSA + -NH₂ surface

IS → $E_{a1}$ → TS

TSA + -NHCl surface

IS → $E_{a9}$ → TS

TSA + -NCl₂ surface

$$E_{a1} : E_{a9} : E_{a11} \cong 1 : 0.6 : 0.8$$
$$(E_{a1} > E_{a11} > E_{a9})$$

TSA + −NH₂ surface

IS     $E_{a1}$     FS

TSA + −NHCl surface

IS     $E_{a12}$     FS

TSA + −NCl₂ surface

| Surface | FS (eV) |
|---------|---------|
| $-NH_2$ | 0.015 |
| $-NHCl$ | $-2.67$ |
| $-NCl_2$ | $-0.27$ |

DEPOSITION METHOD AND PLASMA PROCESSING APPARATUS

CROSS-REFERENCE TO RELATED APPLICATION

The present application is based upon and claims priority to Japanese Patent Application No. 2021-002978, filed on Jan. 12, 2021, the entire contents of which are incorporated herein by reference.

BACKGROUND

1. Field

The present disclosure relates to a deposition method and a plasma processing apparatus.

2. Background Art

A deposition method is known in which a thin film made of an impurity-containing silicon nitride film is formed on the surface of a wafer by supplying a silane-based gas, a nitride gas, and an impurity-containing gas into a process container (see, for example, Patent Document 1). In this deposition method, the silane-based gas and the nitride gas are alternately supplied, the impurity-containing gas is simultaneously supplied with a silicon-based gas, and the nitride gas is activated by plasma.

PRIOR ART DOCUMENT

Patent Document

[Patent Document 1] Japanese Laid-open Patent Publication No. 2006-270016

The present disclosure provides a technique that enables to deposit a high-quality film at a low temperature and a high cycle rate.

SUMMARY

According to one aspect of the present disclosure, a deposition method of depositing a silicon nitride film on a surface of a substrate includes: (a) exposing the substrate to a plasma formed from a nitriding gas containing nitrogen (N) and hydrogen (H); (b) exposing the substrate to a plasma formed from hydrogen ($H_2$) gas; (c) exposing the substrate to a plasma formed from a process gas containing a halogen; (d) supplying trisilylamine (TSA) to the substrate; and (e) repeating (a) to (d) in this order.

According to the present disclosure, a high-quality film can be deposited at a low temperature and a high cycle rate.

BRIEF DESCRIPTION OF THE DRAWINGS

FIG. 10 is a diagram illustrating analysis results of physical adsorption energy and activation energy;

FIGS. 17A to 17C are diagrams illustrating a reaction of TSA to a chlorinated surface;

FIGS. 18A to 18C are diagrams illustrating a reaction of TSA to a chlorinated surface;

FIG. 20 is a diagram comparing an activation energy of a reaction of TSA to each surface;

FIG. 22 is a diagram comparing an energy of a final state of a reaction of TSA to each surface.

DESCRIPTION OF THE EMBODIMENTS

Figure 1:
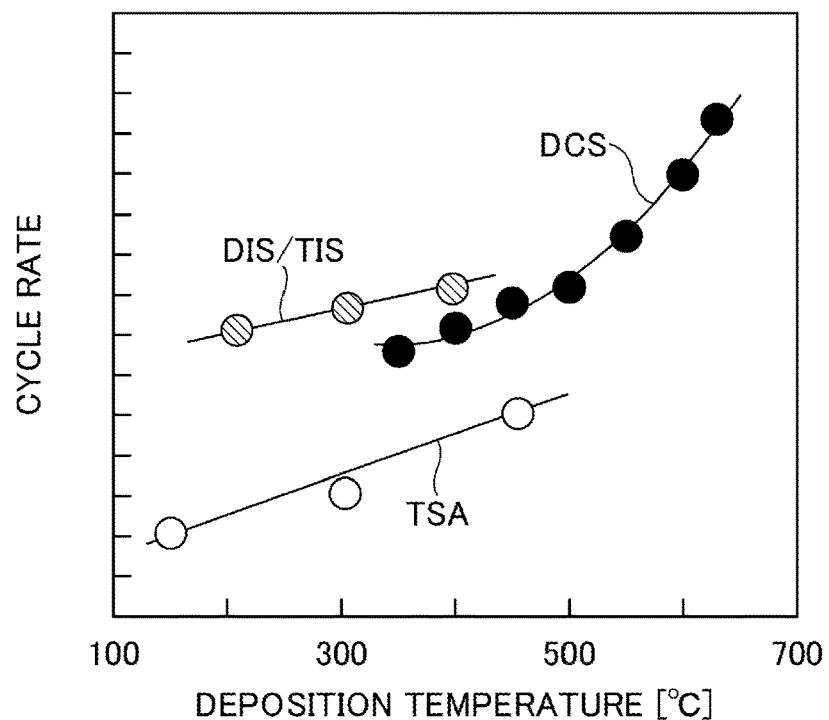
FIG. 1 is a diagram illustrating a relationship between a deposition temperature of a SiN film and a cycle rate.

In the following, non-limiting exemplary embodiments of the present disclosure will be described with reference to the accompanying drawings. In all the accompanying drawings, the same or corresponding reference numerals shall be attached to the same or corresponding members or components and overlapping descriptions may be omitted.

Silicon Nitride Film

Figure 2:
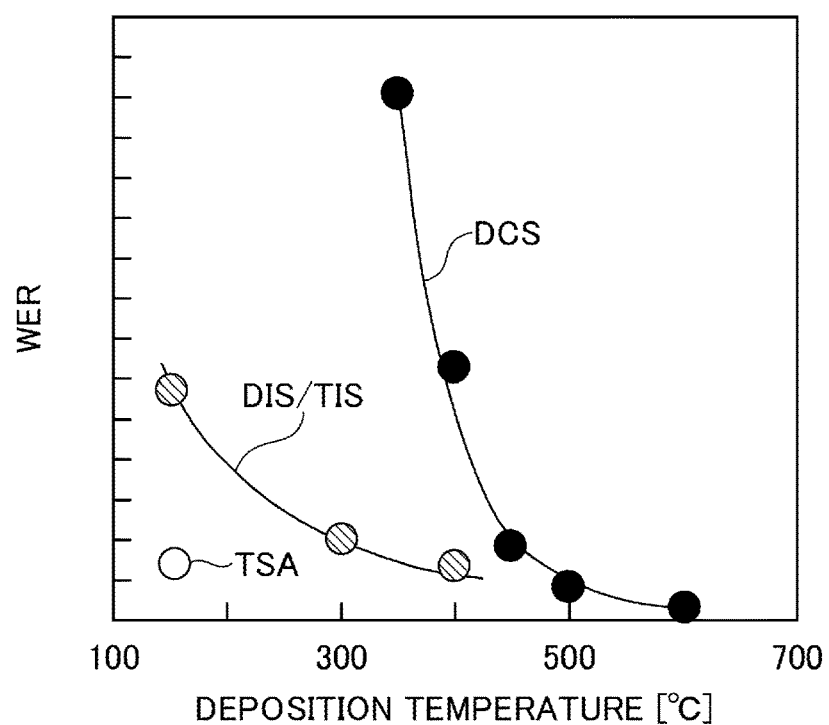
FIG. 2 is a diagram illustrating a relationship between the deposition temperature of the SiN film and a WER.

Referring to FIG. 1 and FIG. 2, a cycle rate and a wet etching rate (WER) when a silicon nitride film (SiN film) is deposited on a substrate by an atomic layer deposition (ALD) method will be described.

In the ALD method, a SiN film is deposited by repeating a cycle including a step of supplying a silicon (Si) raw material gas and a step of nitriding the Si raw material gas. For example, dichlorosilane (DCS), diiodosilane (DIS), triiodosilane (TIS), and trisilylamine (TSA:$(SiH_3)_3N$) may be used as the silicon raw material gas. In the nitriding step, for example, an $NH_3$ plasma is used.

The cycle rate is a deposition amount of a SiN film per cycle in the ALD method. The WER is an etching rate when a SiN film is wet etched using a dilute hydrofluoric acid (DHF) with a fluoric acid concentration of 0.5%, and is an index for evaluating the film quality of the SiN film. For example, a lower WER means a higher quality film.

FIG. 1 is a diagram illustrating a relationship between the deposition temperature of the SiN film and the cycle rate. In FIG. 1, the horizontal axis represents the deposition temperature [° C.] and the vertical axis represents the cycle rate.

FIG. 2 is a diagram illustrating a relationship between the deposition temperature of the SiN film and the WER. In FIG. 2, the horizontal axis indicates the deposition temperature [° C.] and the vertical axis indicates the WER.

For DCS, the cycle rate is high in the temperature range of 350° C. to 650° C. as illustrated in FIG. 1, but the WER is high in the temperature range of 400° C. or less as illustrated in FIG. 2. Therefore, DCS is not suitable for depositing a high-quality film at a low temperature.

For DIS and TIS, the cycle rate is high in the temperature range of 200° C. to 400° C. as illustrated in FIG. 1 and the WER is low in the temperature range of 300° C. to 400° C. as illustrated in FIG. 2. Therefore, it can be said that DIS and TIS are promising from the viewpoint of depositing a high-quality film at a low temperature and a high cycle rate. However, DIS and TIS have problems in reducing film thickness uniformity and handling by-products. In particular, for TIS, the vapor pressure is low and it is difficult to provide a large flow rate of gas in a short period of time.

For TSA, the WER is very low in the temperature range of 300° C. or less (e.g., 150° C.), as illustrated in FIG. 2. Therefore, it is promising from the viewpoint of depositing a high-quality film at a low temperature. However, TSA has a cycle rate lower than that of DCS, DIS and TIS as illustrated in FIG. 1.

Accordingly, as a result of having carefully studied technologies for depositing a high-quality film at a low temperature and a high cycle rate, the present inventors have found that, when TSA adsorbs to a —$NH_2$ surface, the silylation reaction dominates over the dehydrogenation reaction, thus the cycle rate decreases. Because the silylation reaction is a reaction in which one of three Si included in TSA adsorbs on the —$NH_2$ surface, the cycle rate is lower than in the dehydrogenation reaction in which all three Si included in TSA adsorb on the —$NH_2$ surface.

The present inventors also have found that upon exposing the —$NH_2$ surface to hydrogen and chlorine plasma before TSA is adsorbed on the —$NH_2$ surface, when TSA adsorbs to the —$NH_2$ surface, the dehydrogenation reaction dominates over the silylation reaction and the cycle rate increases.

In the following, a plasma processing apparatus and a deposition method according to an embodiment capable of depositing a high-quality film at a low temperature and a high cycle rate will be described.

Plasma Processing Apparatus

Figure 3:
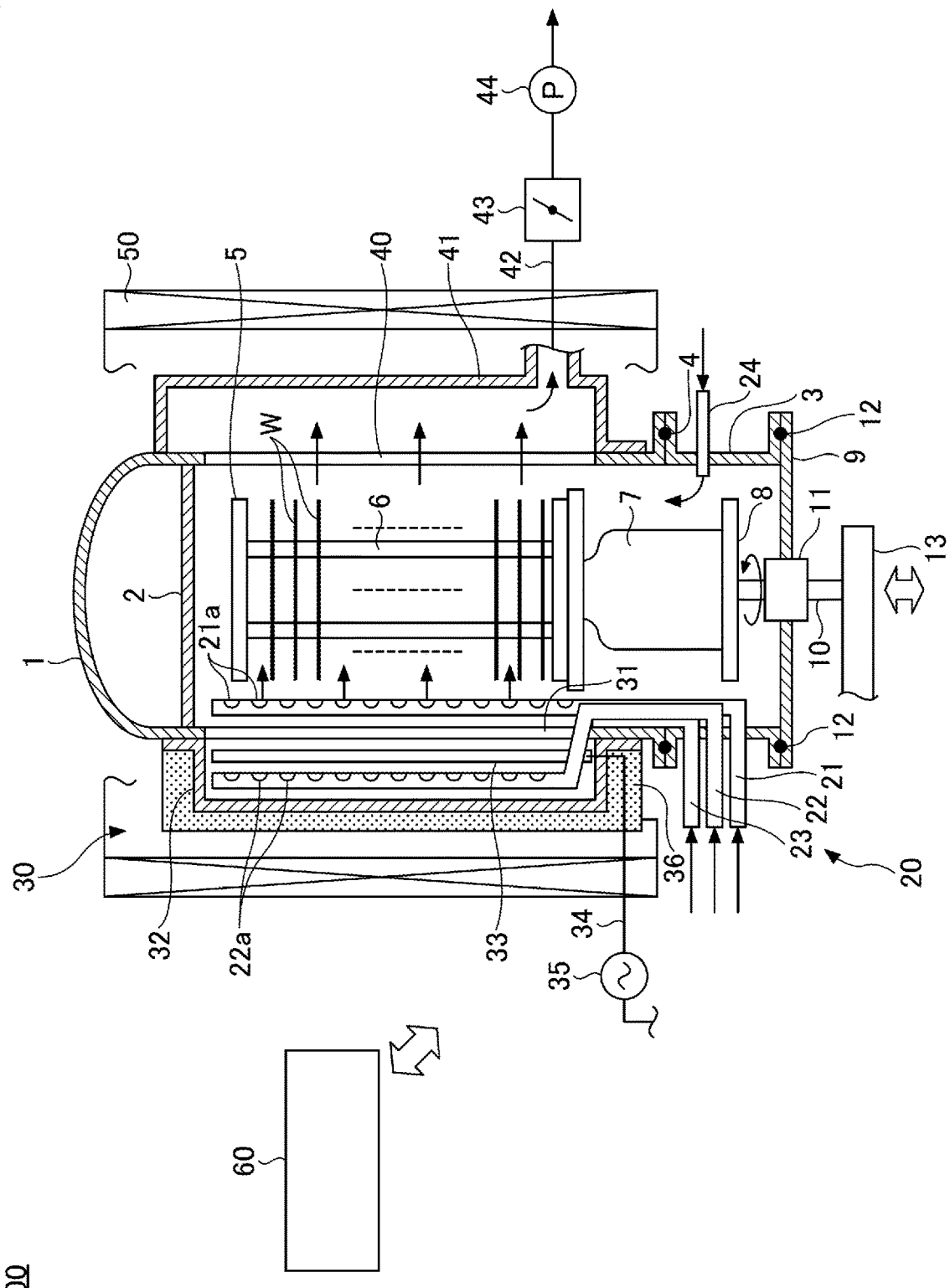
FIG. 3 is a schematic longitudinal cross-sectional view illustrating an example of a plasma processing apparatus according to an embodiment.
Figure 4:
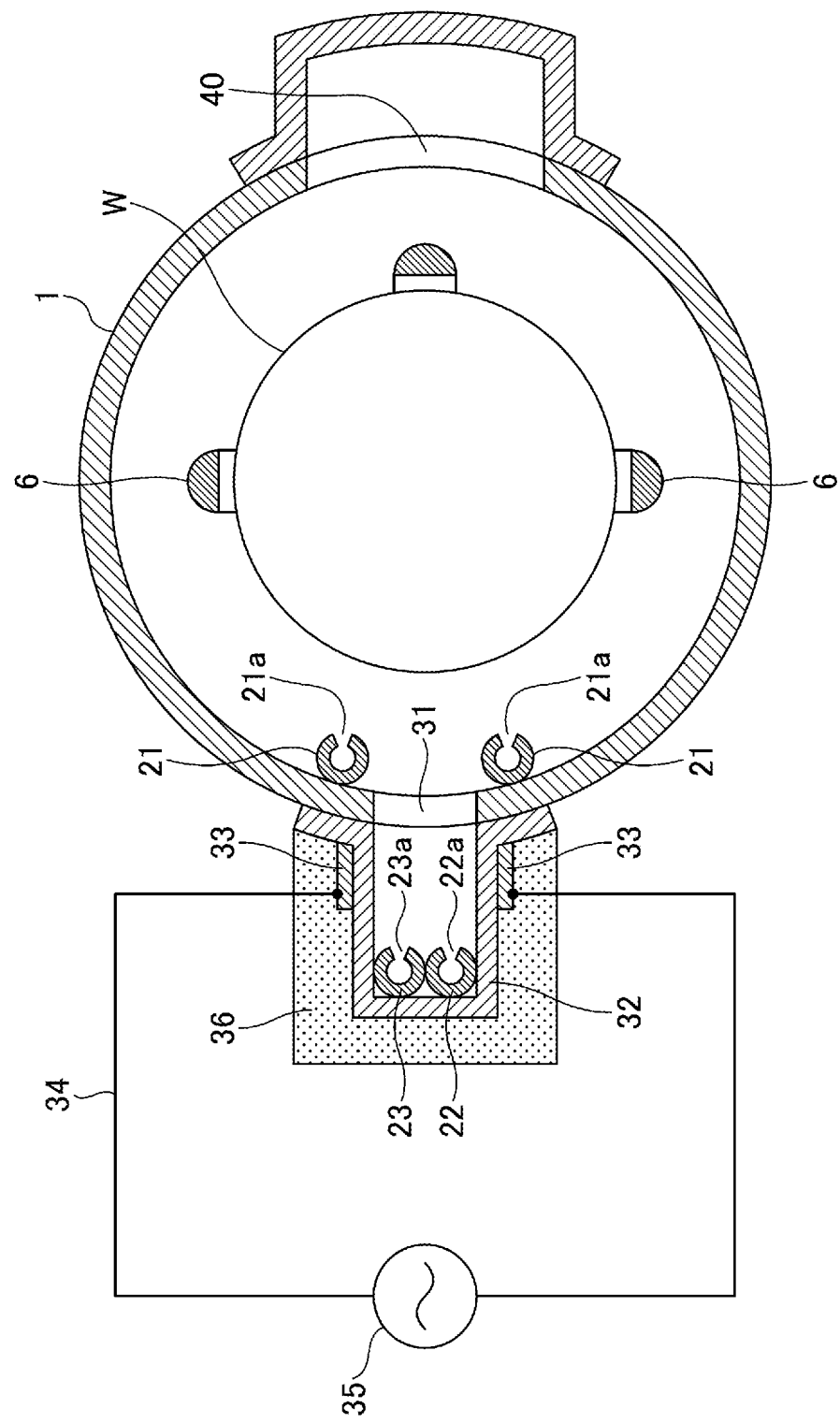
FIG. 4 is a schematic lateral cross-sectional view illustrating an example of the plasma processing apparatus according to the embodiment.

Referring to FIG. 3 and FIG. 4, an example of a plasma processing apparatus according to an embodiment will be described.

The plasma processing apparatus 100 includes a process container 1 having a cylindrical shape with a ceiling and an opened lower end. The entire process container 1 may be made of, for example, quartz. A ceiling plate 2 formed of quartz is provided near the upper end of the process container 1 inside the process container 1, and the region below the ceiling plate 2 is sealed. A manifold 3 formed of a metal in a cylindrical shape is coupled to the opening at the lower end of the process container 1 via a seal member 4 such as an O-ring.

The manifold 3 supports the lower end of the process container 1, and a wafer boat 5 is inserted into the process container 1 from the lower portion of the manifold 3. In the wafer boat 5, a large number of (e.g., 25 to 150) substrates W are arranged in multiple stages. In this way, a large number of wafers W are accommodated substantially horizontally at intervals along the vertical direction in the process container 1. The wafer boat 5 may be made of, for example, quartz. The wafer boat 5 has three rods 6 (see FIG. 2), and a large number of wafers W are supported by grooves (not illustrated) formed in the rods 6. The substrates W may be, for example, semiconductor wafers.

The wafer boat 5 is placed on a table 8 via a heat reserving cylinder 7 made of quartz. The table 8 is supported on a rotary shaft 10 that penetrates a lid 9 made of a metal (stainless steel) and configured to open and close the opening of the lower end of the manifold 3.

A magnetic fluid seal 11 is provided at the penetrating portion of the rotary shaft 10, and airtightly seals and rotatably supports the rotary shaft 10. A seal member 12 is provided between the peripheral portion of the lid 9 and the lower end of the manifold 3 to maintain the airtightness inside the process container 1.

The rotary shaft 10 is attached to the tip of an arm 13 supported by a lifting and lowering mechanism (not illustrated) such as a boat elevator, and the wafer boat 5 and the lid 9 are integrally lifted and lowered and inserted into and removed from the process container 1. The table 8 may be provided to be fixed to the lid 9, and the wafers W may be processed without rotating the wafer boat 5.

The plasma processing apparatus 100 includes a gas supply section 20 that supplies a predetermined gas such as a process gas or a purge gas into the process container 1.

The gas supply section 20 includes gas supply pipes 21 to 24. The gas supply pipes 21 to 24 may be made of, for example, quartz. The gas supply pipes 21 to 24 penetrate the side wall of the manifold 3 inward, are bent upward, and extend vertically. A plurality of gas holes 21a to 23a are formed at predetermined intervals in the vertical portions of the gas supply pipes 21 to 23, respectively, over the vertical length corresponding to the substrate support range of the boat 5. Each of the gas holes 21a to 23a injects a gas in the horizontal direction. The gas supply pipe 24 is made of, for example, quartz, and includes a short quartz pipe provided to penetrate the side wall of the manifold 3. In the illustrated example, two gas supply pipes 21, one gas supply pipe 22, one gas supply pipe 23, and one gas supply pipe 24 are provided.

The vertical portion of each gas supply pipe 21 is provided inside the process container 1. TSA is supplied to the gas supply pipe 21 from a raw material gas supply source through a gas pipe. The gas pipe is provided with a flow rate controller and an opening/closing valve. Accordingly, TSA from the raw material gas supply source is supplied into the process container 1 through the gas pipe and the gas supply pipe 21 at a predetermined flow rate.

The vertical portion of the gas supply pipe 22 is provided in a plasma generation space to be described later. Ammonia ($NH_3$) gas is supplied to the gas supply pipe 22 from an ammonia gas supply source through a gas pipe. The gas pipe is provided with a flow rate controller and an opening/closing valve. Accordingly, the $NH_3$ gas from the ammonia gas supply source is supplied at a predetermined flow rate to the plasma generation space through the gas pipe and the gas supply pipe 22, is turned into plasma in the plasma generation space, and is supplied into the process container 1. Also, hydrogen ($H_2$) gas is supplied to the gas supply pipe 22 from a hydrogen gas supply source through a gas pipe. The gas pipe is provided with a flow rate controller and an opening/closing valve. Accordingly, the $H_2$ gas from the hydrogen gas supply source is supplied at a predetermined flow rate to the plasma generation space through the gas pipe and the gas supply pipe 22, is turned into plasma in the plasma generation space, and is supplied into the process container 1.

The vertical portion of the gas supply pipe 23 is provided in the plasma generation space to be described later. Chlorine ($Cl_2$) gas is supplied to the gas supply pipe 23 from a chlorine gas supply source through a gas pipe. The gas pipe is provided with a flow rate controller and an opening/closing valve. Accordingly, the $Cl_2$ gas from the chlorine gas supply source is supplied at a predetermined flow rate to the plasma generation space through the gas pipe and the gas supply pipe 23, is turned into plasma in the plasma generation space, and is supplied into the process container 1.

The purge gas is supplied to the gas supply pipe 24 from a purge gas supply source through a gas pipe. The gas pipe is provided with a flow rate controller and an opening/closing valve. Accordingly, the purge gas from the purge gas supply source is supplied at a predetermined flow rate into the process container 1 through the gas pipe and the gas supply pipe 24. Examples of the purge gas may include an inert gas such as argon (Ar) or nitrogen ($N_2$). The purge gas may be supplied to at least one of the gas supply pipes 21 to 23.

A plasma generation mechanism 30 is formed at a portion of the side wall of the process container 1. The plasma generation mechanism 30 turns the nitriding gas into plasma to generate an active species for nitriding. The plasma generation mechanism 30 turns the $H_2$ gas into plasma to generate hydrogen (H) radicals. The plasma generation mechanism 30 turns the $Cl_2$ gas into plasma to generate chlorine (Cl) radicals.

The plasma generation mechanism 30 includes a plasma partition wall 32, a pair of plasma electrodes 33, a power supply line 34, a radio-frequency power source 35, and an insulating protection cover 36.

The plasma partition wall 32 is airtightly welded to the outer wall of the process container 1. The plasma partition wall 32 may be formed of, for example, quartz. The plasma partition wall 32 has a recessed cross section, and covers an opening 31 formed in the side wall of the process container 1. The opening 31 is formed to be elongated in the vertical direction so as to cover all of the wafers W supported by the wafer boat 5 along the vertical direction. In the inner space that is defined by the plasma partition wall 32 and that communicates with the inside of the process container 1, that is, in the plasma generation space, the gas supply pipes 22 and 23 are arranged. The gas supply pipes 21 are located near the wafers W along the inner side wall of the process container 1 outside the plasma generation space. In the illustrated example, the two gas supply pipes 21 are arranged at positions between which the opening 31 is disposed. However, the present disclosure is not limited thereto, and for example, only one of the two gas supply pipes 21 may be disposed.

The pair of plasma electrodes 33 each have an elongated shape, and are arranged on the outer surfaces of both side walls of the plasma partition wall 32 along the vertical direction while facing each other. The power supply line 34 is connected to the lower end of each plasma electrode 33.

The power supply line 34 electrically connects each plasma electrode 33 and the radio-frequency power source 35. In the illustrated example, one end of the power supply line 34 is connected to the lower end of each plasma electrode 33 which is a lateral portion of the short side of the plasma electrode 33, and the other end thereof is connected to the radio-frequency power source 35.

The radio-frequency power source 35 is connected to the lower end of each plasma electrode 33 via the power supply line 34, and supplies a radio-frequency power of, for example, 13.56 MHz to the pair of plasma electrodes 33. As a result, the radio-frequency power is applied to the plasma generation space defined by the plasma partition wall 32.

The $NH_3$ gas discharged from the gas supply pipe 22 is turned into plasma in the plasma generation space to which the radio-frequency power is applied, and nitriding active species generated by the plasma are supplied into the process container 1 through the opening 31. The $H_2$ gas discharged from the gas supply pipe 22 is turned into plasma in the plasma generation space to which the radio frequency power is applied, and hydrogen radicals generated by the plasma are supplied into the process container 1 through the opening 31. Further, the $Cl_2$ gas discharged from the gas supply pipe 23 is turned into plasma in the plasma generation space to which the radio-frequency power is applied, and chlorine radicals generated by the plasma are supplied into the process container 1 through the opening 31.

The insulating protection cover 36 is attached to the outer side of the plasma partition wall 32 so as to cover the plasma partition wall 32. A coolant passage (not illustrated) is provided inside the insulating protection cover 36, and a coolant such as cooled nitrogen ($N_2$) gas flows in the coolant passage so that the plasma electrodes 33 are cooled. Further, a shield (not illustrated) may be provided between the plasma electrodes 33 and the insulating protection cover 36 to cover the plasma electrodes 33. The shield is made of, for example, a good conductor such as a metal, and is grounded.

An exhaust port 40 is provided in the side wall portion of the process container 1 to evacuate the inside of the process container 1. The exhaust port 40 is formed in a vertically elongated shape corresponding to the wafer boat 5. An exhaust port cover member 41 is attached to the portion that corresponds to the exhaust port 40 of the process container 1, and has a U-shaped cross section to cover the exhaust port 40. The exhaust port cover member 41 extends upward along the side wall of the process container 1. An exhaust pipe 42 is connected to the lower portion of the exhaust port cover member 41 to exhaust the process container 1 through the exhaust port 40. An exhaust device 44 is connected to the exhaust pipe 42, and includes a pressure control valve 43 that controls the pressure inside the process container 1, a vacuum pump and others. The inside of the process container 1 is exhausted by the exhaust device 44 through the exhaust pipe 42.

Further, a cylindrical heating mechanism 50 is provided to surround the outer periphery of the process container 1. The heating mechanism 50 heats the process container 1 and the wafers W inside the process container 1.

The plasma processing apparatus 100 includes a controller 60. The controller 60 performs a deposition method, which will be described below, by controlling the operation of each section of the plasma processing apparatus 100, for example. The controller 60 may be, for example, a computer or the like. A computer program for operating each section of the plasma processing apparatus 100 is stored in a storage medium. The storage medium may be, for example, a flexible disk, a compact disk, a hard disk, a flash memory, a DVD, or the like.

<Deposition Method>

Figure 5:
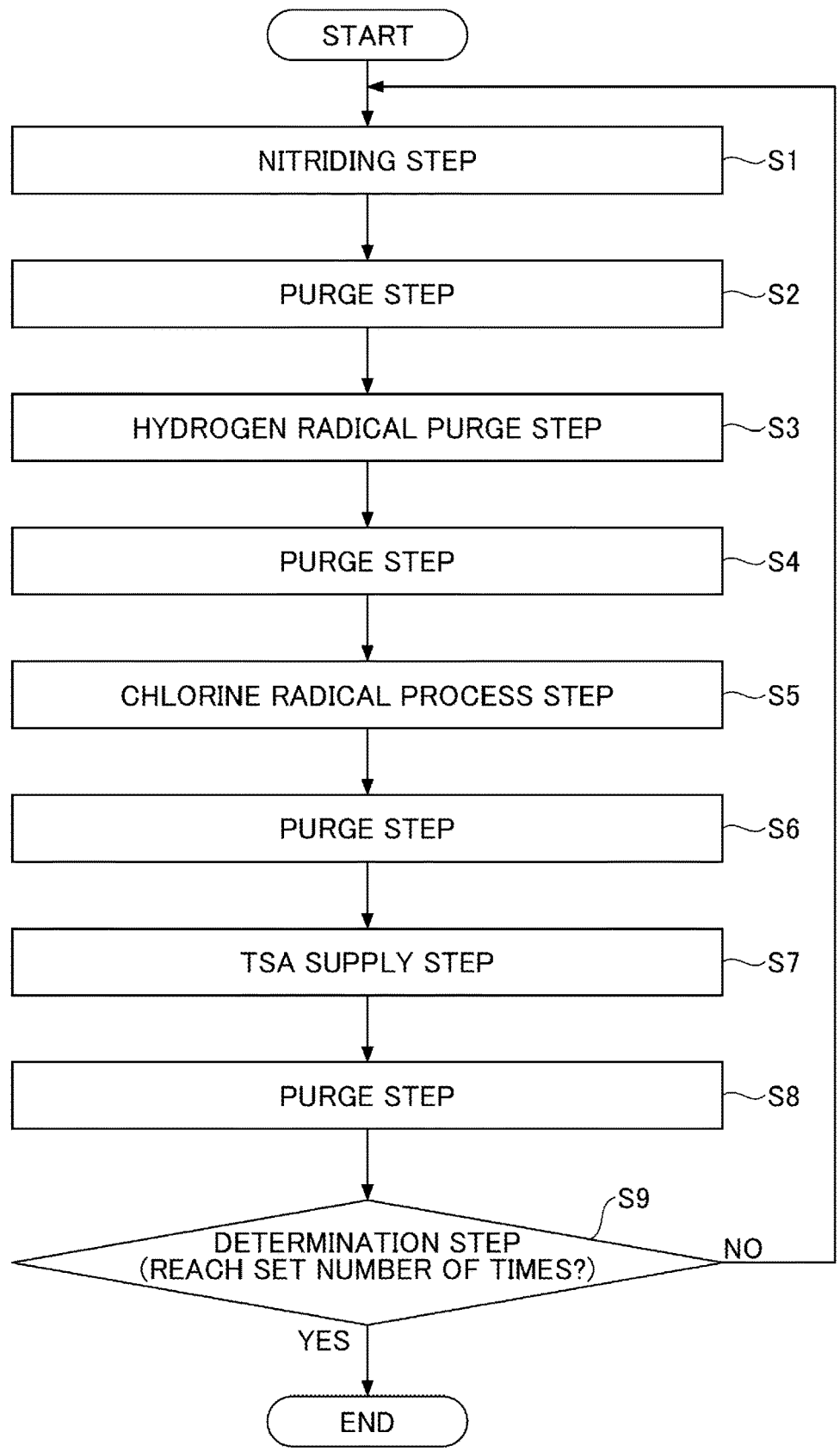
FIG. 5 is a flowchart illustrating an example of a deposition method according to the embodiment.
Figure 6:
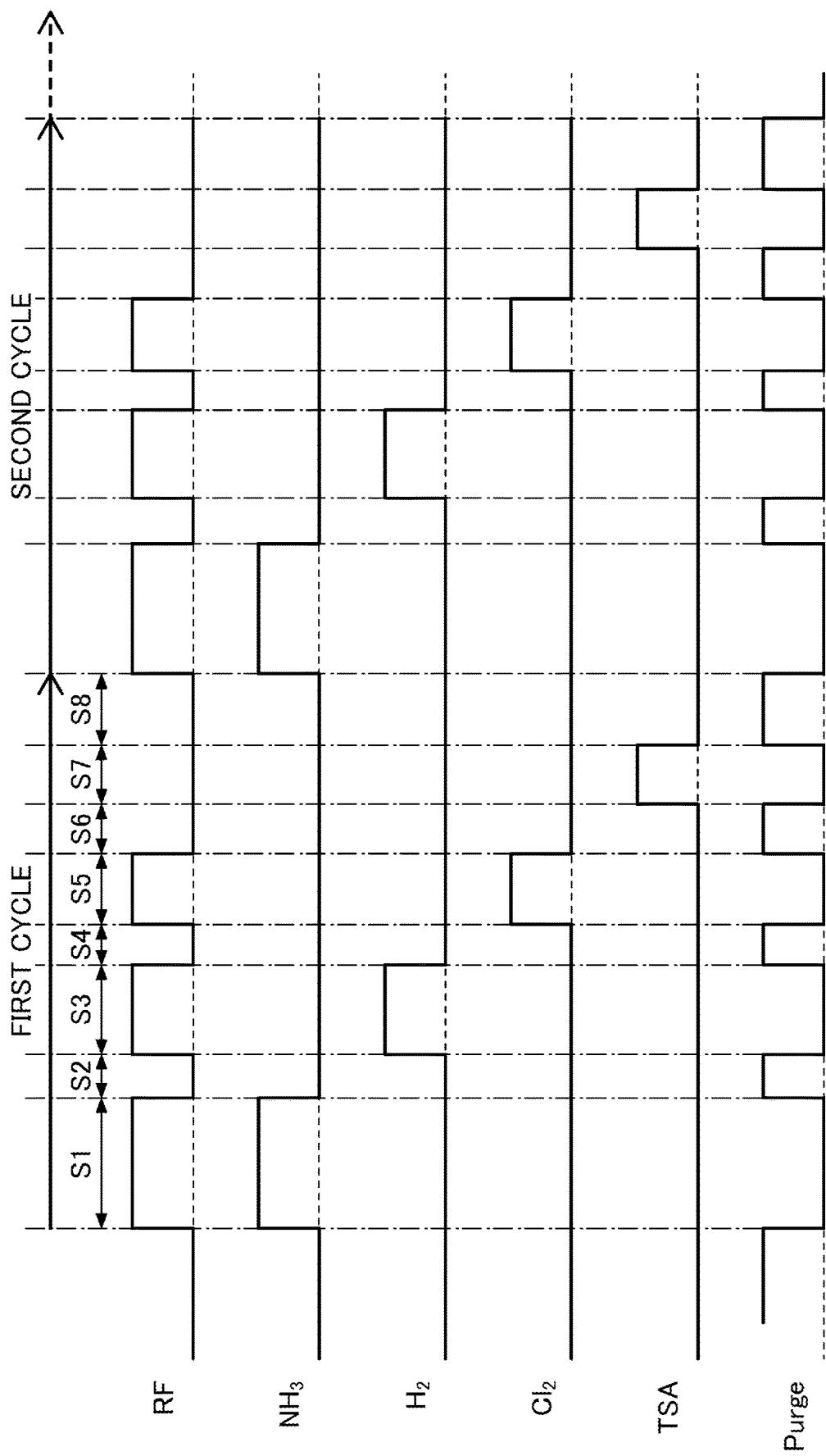
FIG. 6 is a timing chart illustrating an example of the deposition method according to the embodiment.

Referring to FIG. 5 and FIG. 6, an example of a deposition method performed by the plasma processing apparatus 100 according to the embodiment will be described.

The deposition method according to the embodiment is a method of depositing a SiN film, and includes a nitriding step S1, a purge step S2, a hydrogen radical purge step S3, a purge step S4, a chlorine radical process step S5, a purge step S6, a TSA supply step S7, a purge step S8, and a determination step S9. The nitriding step S1, the purge step S2, the hydrogen radical purge step S3, the purge step S4, the chlorine radical process step S5, the purge step S6, the TSA supply step S7, and the purge step S8 are repeated in this order until it is determined that a set number of times has been reached in the determination step S9. The deposition method according to the embodiments is performed at a low temperature, e.g., a temperature of 500° C. or less, preferably 300° C. or less. Each step will be described below.

In the nitriding step S1, the substrate W is exposed to a plasma formed from $NH_3$ gas. In the present embodiment, by supplying the $NH_3$ gas from the gas supply pipe 22 into the process container 1 and applying RF power to the pair of plasma electrodes 33 from the RF power source 35, the $NH_3$ gas is converted into plasma to generate an active species for nitridation and the generated species is supplied to the substrate W. This generates —$NH_2$ on the surface of the substrate W.

In the purge step S2, the atmosphere in the process container 1 is replaced from $NH_3$ gas with $N_2$ gas. In the present embodiment, the atmosphere in the process container 1 is replaced from the $NH_3$ gas with the $N_2$ gas by supplying the $N_2$ gas from the gas supply pipe 24 into the process container 1 while exhausting the inside of the process container 1 by the exhaust device 44. The purge step S2 may be omitted.

In the hydrogen radical purge step S3, the substrate W is exposed to a plasma formed from $H_2$ gas. In the present embodiment, by supplying the $H_2$ gas into the process container 1 from the gas supply pipe 22 and applying RF power to the pair of plasma electrodes 33 from the RF power source 35, the $H_2$ gas is converted into plasma to generate hydrogen radicals and the hydrogen radicals are supplied to the substrate W. Thereby, a hydrogen atom (H) of —$NH_2$ generated in the nitriding step S1 is extracted by a hydrogen radical and an unpaired electron is generated on a nitrogen atom (N). In other words, a nitrogen atom (N) is radicalized.

In the purge step S4, the atmosphere in the process container 1 is replaced from $H_2$ gas with $N_2$ gas. In the present embodiment, the atmosphere in the process container 1 is replaced from the $H_2$ gas with the $N_2$ gas by supplying the $N_2$ gas from the gas supply pipe 24 into the process container 1 while evacuating the inside of the process container 1 by the exhaust device 44. The purge step S4 may be omitted.

In the chlorine radical process step S5, the substrate W is exposed to a plasma formed from $Cl_2$ gas. In the present embodiment, by supplying the $Cl_2$ gas from the gas supply pipe 23 into the process container 1 and applying RF power to the pair of plasma electrodes 33 from the RF power source 35, the $Cl_2$ gas is converted into plasma to generate chlorine radicals and the chlorine radicals are supplied to the substrate W. This causes a chlorine radical to react with the unpaired electron on the nitrogen atom (N) generated in the hydrogen radical purge step S3, and the —$NH_2$ surface is chlorinated to generate a N—Cl bond. The N—Cl bond includes —NHCl and —$NCl_2$. Thus, by changing the structure of the substrate surface from —$NH_2$ to —NHCl and/or —$NCl_2$ the activation energy of the adsorption reaction of the silyl group (—$SiH_3$) of TSA to the substrate surface decreases.

In the purge step S6, the atmosphere in the process container 1 is replaced from $Cl_2$ gas with $N_2$ gas. In the present embodiment, the atmosphere in the process container 1 is replaced from the $Cl_2$ gas with the $N_2$ gas by supplying the $N_2$ gas from the gas supply pipe 24 into the process container 1 while evacuating the inside of the process container 1 by the exhaust device 44. The purge step S6 may be omitted.

In the TSA supply step S7, TSA is supplied to the substrate W. In the present embodiment, the TSA is supplied from the gas supply pipe 21 into the process container 1. Thereby, TSA is adsorbed on the surface chlorinated in the chlorine radical process step S5. At this time, because the activation energy of the adsorption reaction of the silyl group (—$SiH_3$) of TSA to the substrate surface decreases, the reaction rate of the chemical adsorption of TSA to the substrate surface increases. As a result, the adsorption amount of TSA on the substrate surface in the TSA supply step S7 is increased. That is, the cycle rate is enhanced.

In the purge step S8, the atmosphere in the process container 1 is replaced from TSA with $N_2$ gas. In the present embodiment, the atmosphere in the process container 1 is replaced from TSA with the $N_2$ gas by supplying the $N_2$ gas from the gas supply pipe 24 into the process container 1 while evacuating the inside of the process container 1 by the exhaust device 44. The purge step S8 may be omitted.

In the determination step S9, it is determined whether or not the cycle from the nitriding step S1 to the purge step S8 reaches the set number of times. The set number of times is determined, for example, according to the film thickness of the SiN film to be deposited. In the determination step S9, when the cycle reaches the set number of times, the process ends. Thus, a SiN film having a desired thickness is deposited on the substrate W. Meanwhile, in the determination step S9, when the cycle does not reach the set number of times, the process returns to the nitriding step S1.

As described above, according to the deposition method according to the embodiment, by repeating the cycle of performing the nitriding step S1, the hydrogen radical purge step S3, the chlorine radical process step S5, and the TSA supply step S7 in this order, the SiN film is formed on the substrate W. This exposes the —$NH_2$ surface to hydrogen plasma and subsequently to chlorine plasma before adsorbing TSA on the —$NH_2$ surface. Thus, when TSA adsorbs to the —$NH_2$ surface, dehydrogenation dominates over silylation, and the cycle rate increases. As a result, a high-quality film can be deposited at a low temperature and at a high cycle rate.

<Simulation Results>

Figure 7:
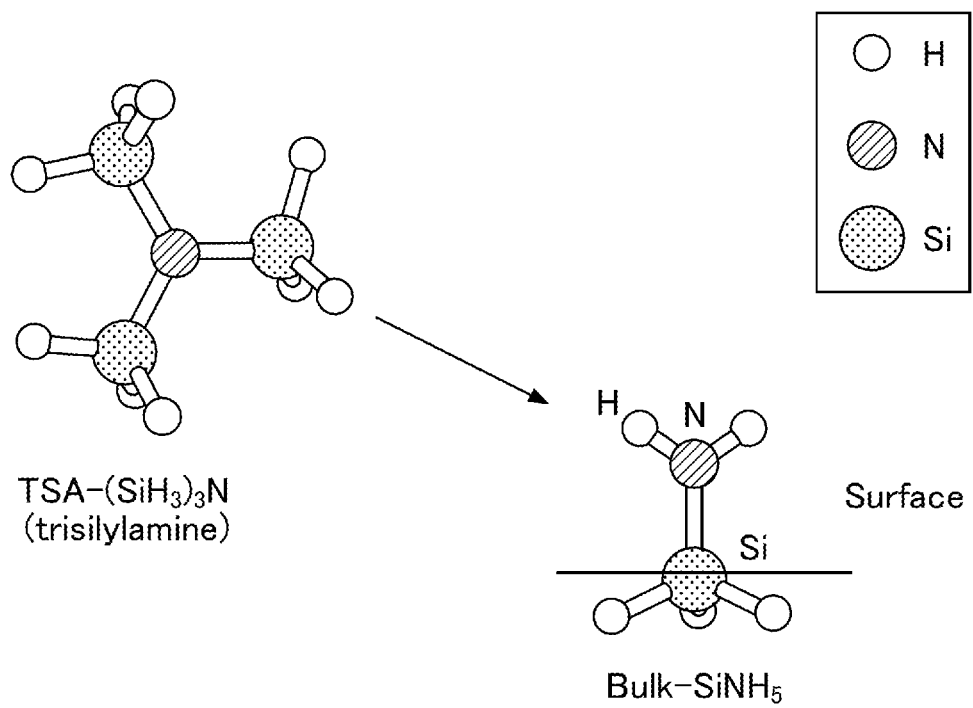
FIG. 7 is a diagram illustrating an initial state of a reaction of TSA to an $NH_2$ surface.

The reaction mechanism of TSA to a —$NH_2$ surface was analyzed using reaction analysis software Gaussian09. In the analysis, as illustrated in FIG. 7, a substrate (Bulk) surface structure was $SiNH_5$ ($H_3Si$—$NH_2$). A functional correction by the empirical dispersion model (gd3bj) was used for calculation of physical adsorption.

Figure 8:
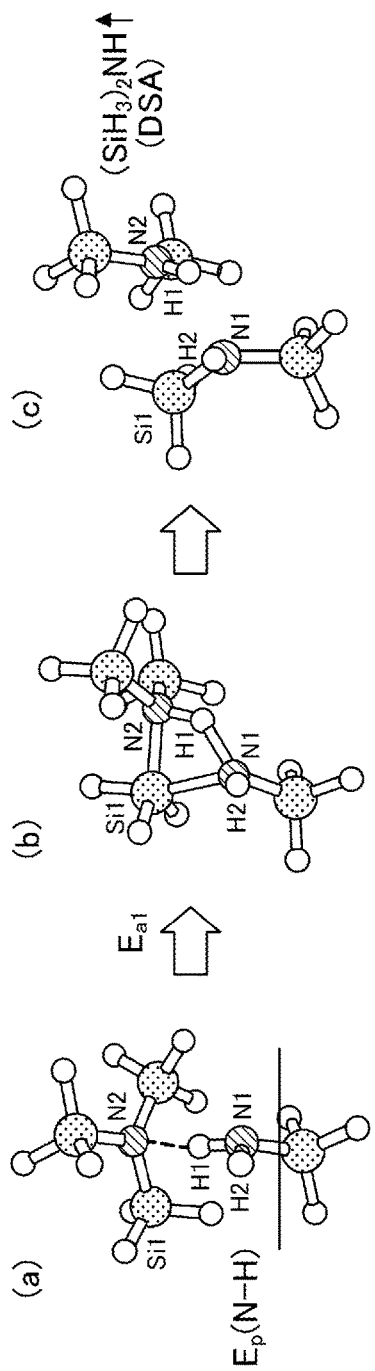
FIG. 8 is a diagram illustrating a first reaction path of TSA to a —$NH_2$ surface.

FIG. 8 is a diagram illustrating a first reaction path of TSA to a —$NH_2$ surface. The first reaction path is a silylation reaction in which a hydrogen atom (H) on the —$NH_2$ surface is replaced with $SiH_3$ by TSA. FIG. 8(a) illustrates a state in which physical adsorption due to Van der Waals force occurs between nitrogen (N2) of TSA and hydrogen (H1) on the —$NH_2$ surface of the substrate. FIG. 8(b) illustrates a transition state in which a ring structure is formed by N1-H1-N2-Si1. FIG. 8(c) illustrates a final state in which nitrogen (N1) on the surface is silylated to generate disilylamine (DSA:$(SiH_3)_2NH$). $E_p$(N—H) represents the energy of the system after physical adsorption, and $E_{a1}$ represents the activation energy.

Figure 9:
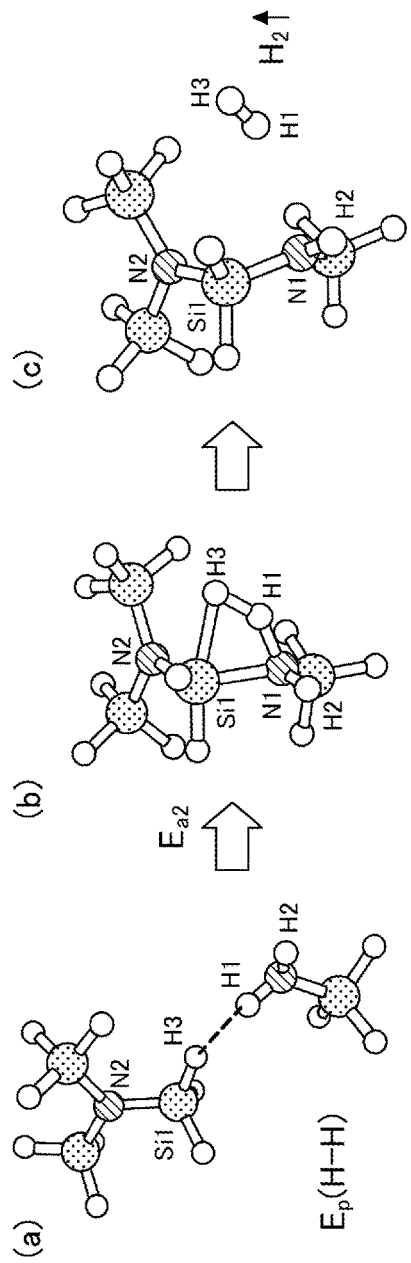
FIG. 9 is a diagram illustrating a second reaction path of TSA to a —$NH_2$ surface.

FIG. 9 is a diagram illustrating a second reaction path of TSA to a —$NH_2$ surface. The second reaction path is a dehydrogenation reaction. FIG. 9(a) illustrates a state in which physical adsorption due to Van der Waals force occurs between hydrogen (H3) of TSA and hydrogen (H1) on the —$NH_2$ surface of the substrate. FIG. 9(b) illustrates a transition state in which a ring structure is formed by N1-H1-H3-Si1. FIG. 9(c) illustrates a final state in which —SiH$_2$N(SiH$_3$)$_2$ is bound to nitrogen (N1) on the surface and a hydrogen molecule (H$_2$) is generated. E$_p$(H—H) represents the energy of the system after physical adsorption, and E$_{a2}$ represents the activation energy.

FIG. 10 is a diagram illustrating the analysis results of physical adsorption energy and activation energy. It is found that both the physical adsorption energy and the activation energy of the first reaction path are smaller than those of the second reaction path and the first reaction path is the main reaction. The activation energy E$_{a1}$ of the first reaction path is slightly greater than 1 eV, which is thought to determine the cycle rate.

Figure 11A:
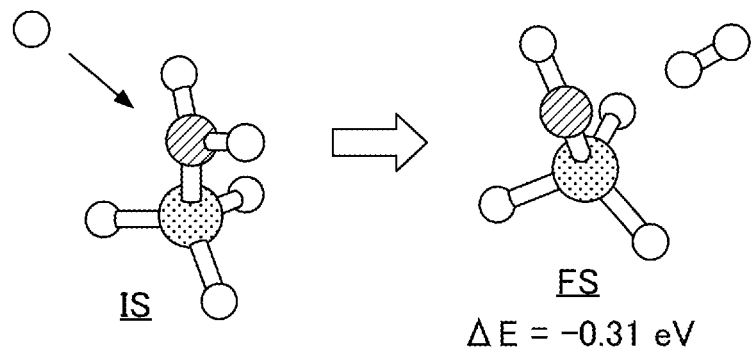
FIGS. 11A and 11B are diagrams illustrating a surface reaction of a hydrogen radical.
Figure 11B:
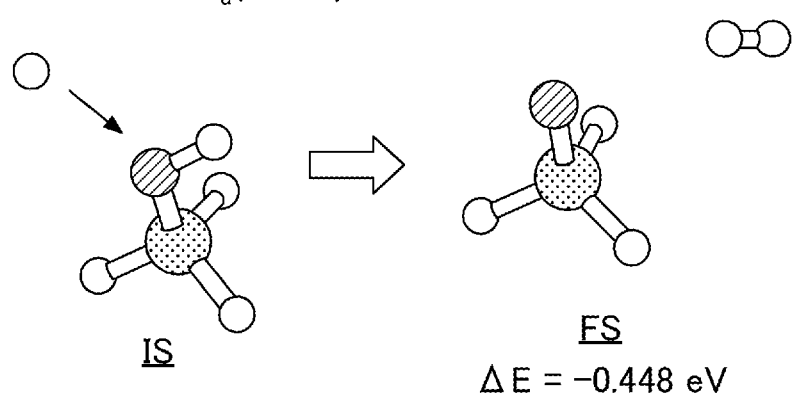

FIGS. 11A and 11B are diagrams illustrating a surface reaction of a hydrogen radical. FIG. 11A illustrates an analysis result of a dehydrogenation reaction of a —NH$_2$ surface by a hydrogen radical. FIG. 11B illustrates an analysis result of a dehydrogenation reaction of a —NH surface by a hydrogen radical. In FIG. 11A and FIG. 11B, the initial state (IS) is illustrated on the left, and the final state (FS) is illustrated on the right. As illustrated in FIG. 11A and FIG. 11B, because the activation energies are small at about 0.3 eV to 0.4 eV, a dehydrogenation reaction of a —NH$_2$ surface by a hydrogen radical and a dehydrogenation reaction of a —NH surface by a hydrogen radical are expected to easily occur.

Figure 12:
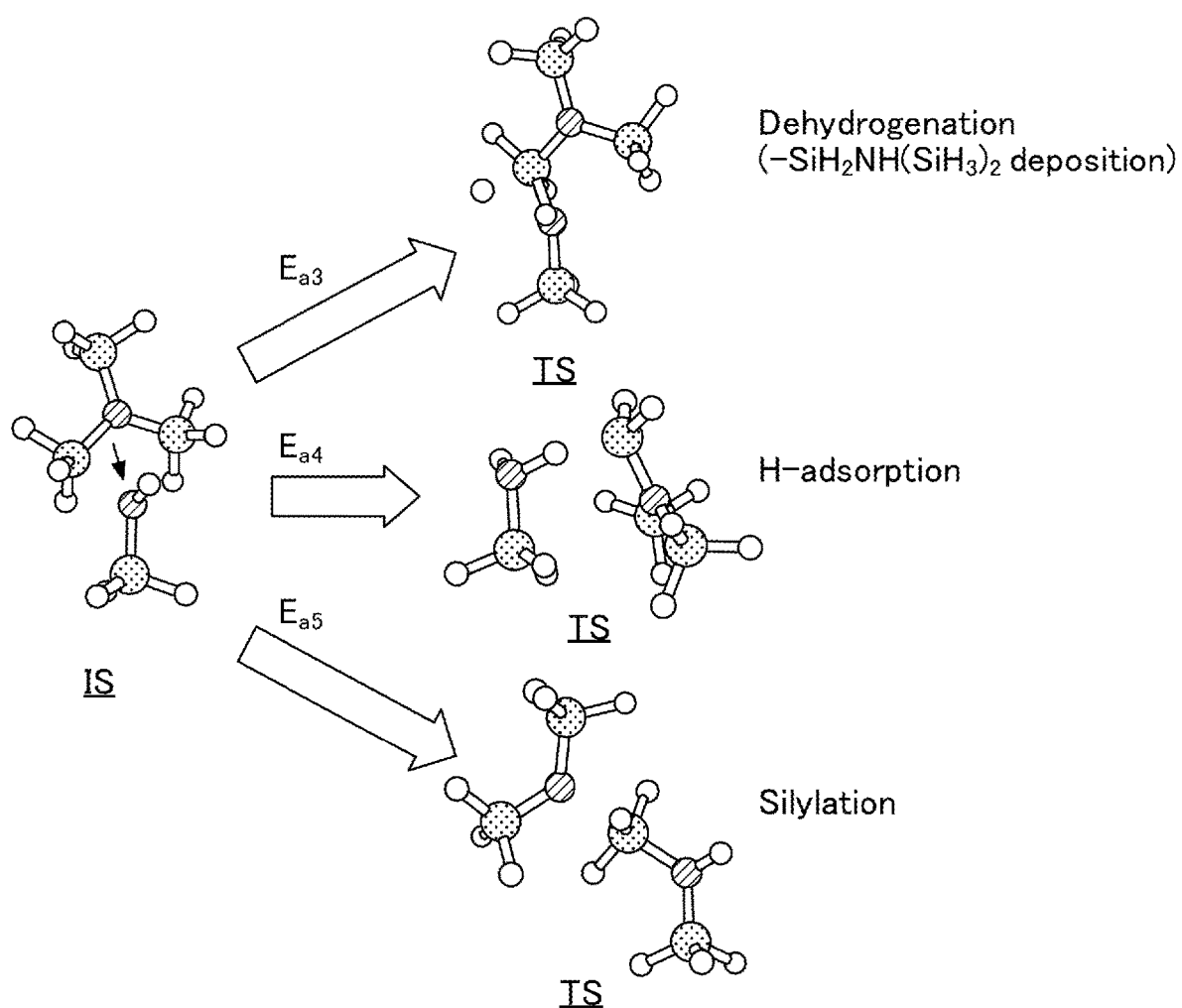
FIG. 12 is a diagram illustrating reaction paths of TSA to a —NH surface.

FIG. 12 is a diagram illustrating reaction paths of TSA to a —NH surface. In FIG. 12, the initial state (IS) is illustrated on the left, and the transition states (TS) are illustrated on the right. As illustrated in FIG. 12, in a case of causing TSA to react with a surface where —NH$_2$ is radicalized into —NH, a dehydrogenation reaction, a H-adsorption reaction, and a silylation reaction occur. The activation energy E$_{a3}$ of the dehydrogenation reaction, the activation energy E$_{a4}$ of the H-adsorption reaction, and the activation energy E$_{a5}$ of the silylation reaction are all small at about ~0.1 eV. Therefore, for a reaction of TSA to the —NH surface, because the dehydrogenation reaction, the H-adsorption reaction, and the silylation reaction occur simultaneously in a mixed manner, the deposition is inefficient.

Figure 13:
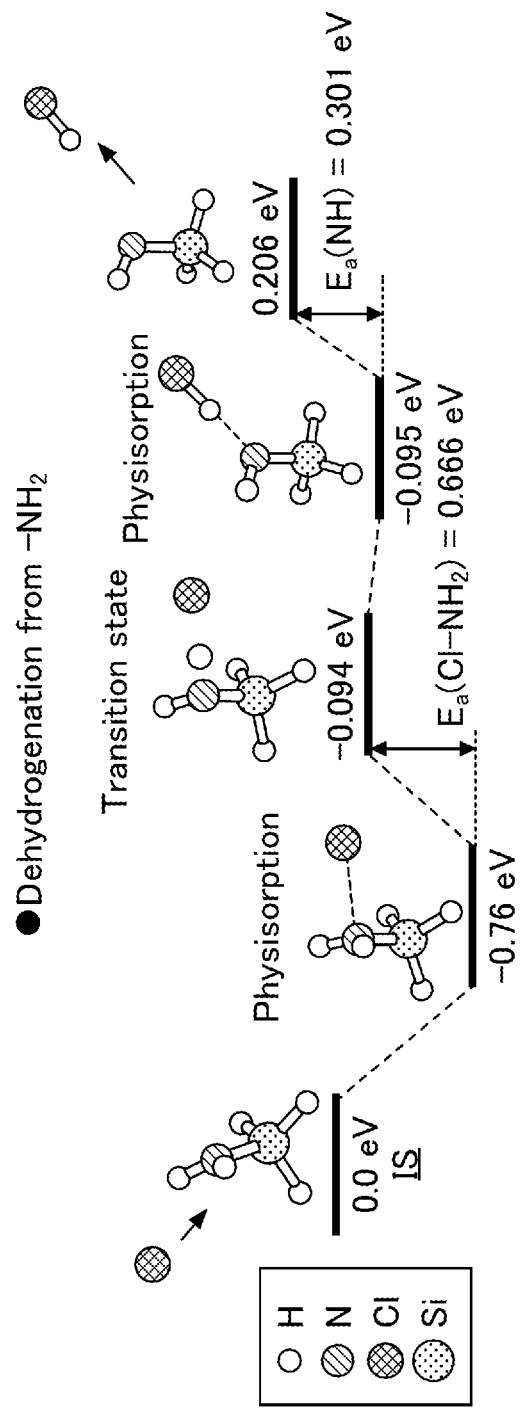
FIG. 13 is a diagram illustrating a surface reaction of a chlorine radical.

FIG. 13 is a diagram illustrating a surface reaction of a chlorine radical and illustrates an analysis result of a dehydrogenation reaction on a —NH$_2$ surface by the chlorine radical. As illustrated in FIG. 13, the chlorine radical physically adsorbs on the —NH$_2$ surface and can be stabilized at −0.76 eV.

Figure 14:
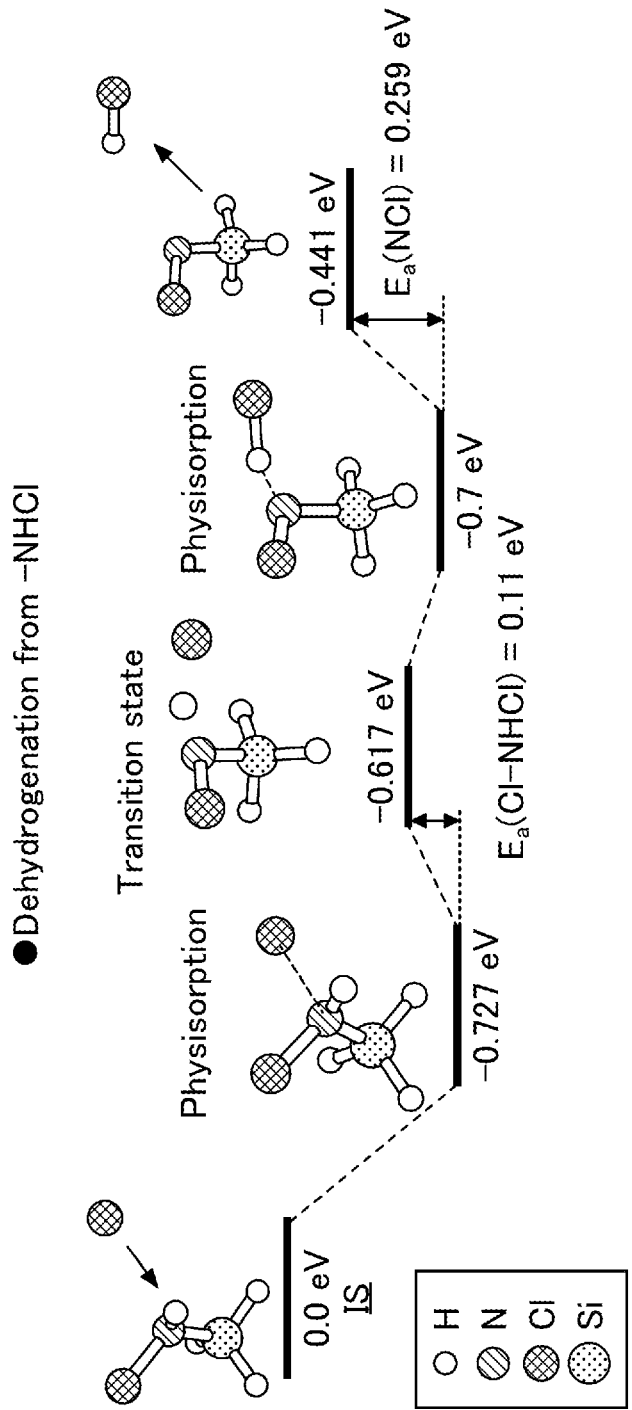
FIG. 14 is a diagram illustrating a surface reaction of a chlorine radical.

FIG. 14 is a diagram illustrating a surface reaction of a chlorine radical and illustrates an analysis result of a dehydrogenation reaction on a —NHCl surface by the chlorine radical. As illustrated in FIG. 14, the chlorine radical physically adsorbs on the —NHCl surface and can be stabilized at −0.73 eV.

Figure 15A:
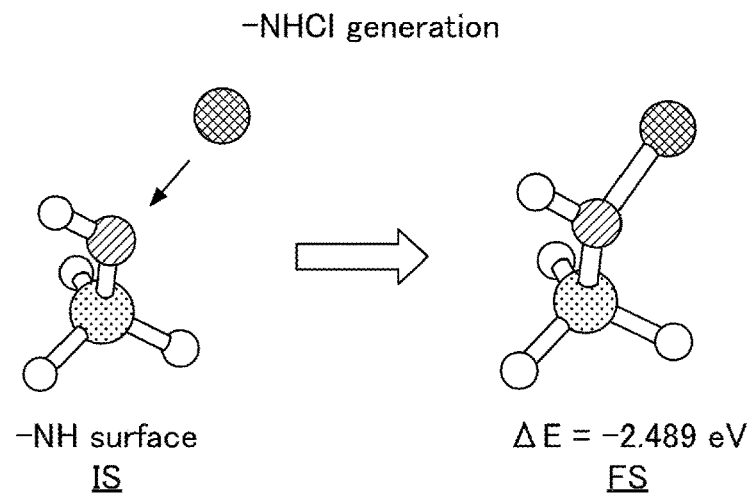
FIGS. 15A to 15C are diagrams each illustrating a surface reaction of a chlorine radical.
Figure 15B:
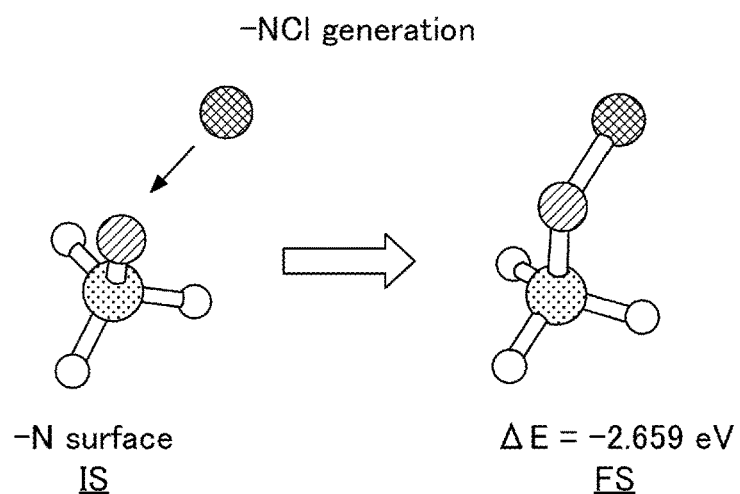
Figure 15C:
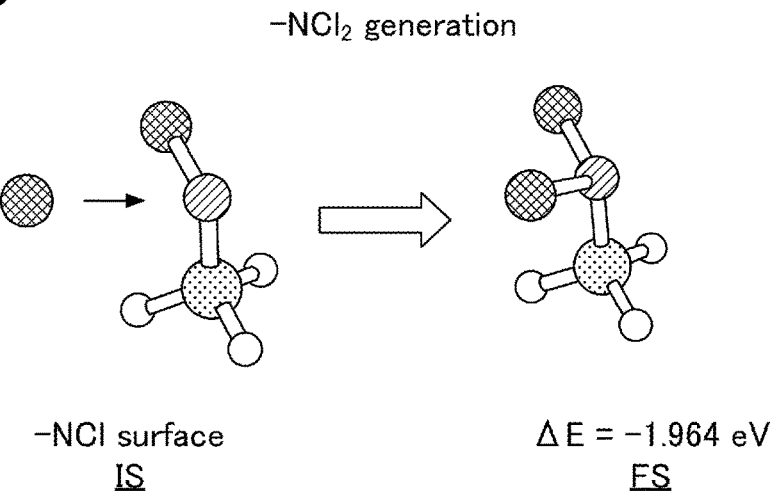

FIGS. 15A to 15C are diagrams each illustrating a surface reaction of a chlorine radical and illustrating an analysis result of a radical coupling reaction. FIG. 15A illustrates an analysis result of an addition reaction (radical coupling reaction) of a chlorine radical to an unpaired electron on a nitrogen atom (N) on a —NH surface. FIG. 15B illustrates an analysis result of an addition reaction (radical coupling reaction) of a chlorine radical to an unpaired electron on a nitrogen atom (N) on a —N surface. FIG. 15C illustrates an analysis result of an addition reaction (radical coupling reaction) of a chlorine radical to an unpaired electron on a nitrogen atom (N) on a NCl surface. In FIG. 15A to FIG. 15C, the initial state (IS) is illustrated on the left, and the final state (FS) is illustrated on the right. The activation energies of the radical coupling reactions illustrated in FIG. 15A to FIG. 15C are small at about ~0.1 eV and therefore easily occur. Thus, it is considered that, by radicalizing the substrate surface with a hydrogen radical (generating an unpaired electron), it is possible to generate an N—Cl bond on the surface with a chlorine radical.

Figure 16A:
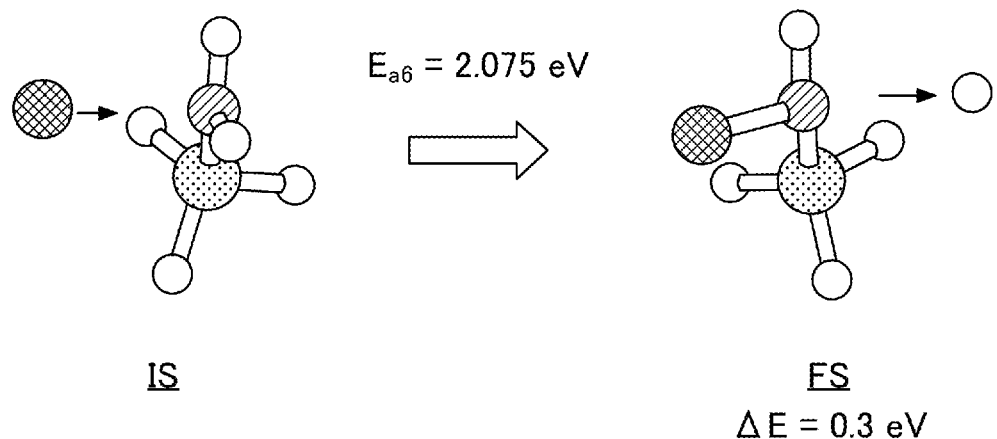
FIGS. 16A and 16B are diagrams each illustrating a surface reaction of a chlorine radical.
Figure 16B:
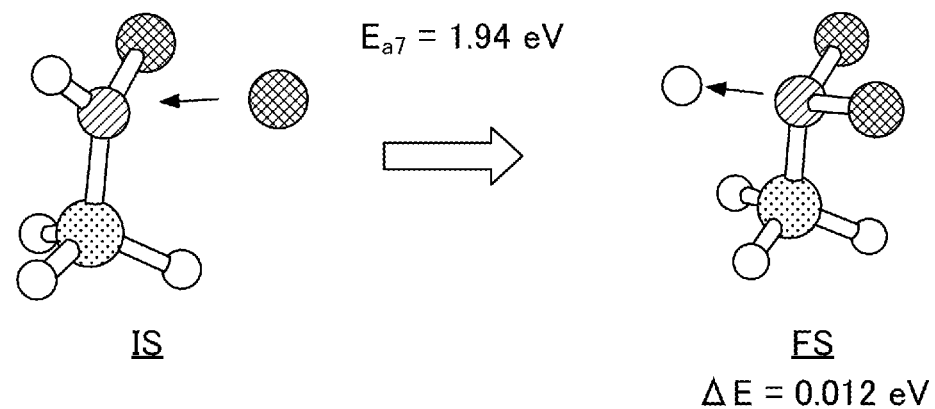

FIGS. 16A and 16B are diagrams each illustrating a surface reaction of a chlorine radical, and illustrating an analysis result of a substitution reaction. FIG. 16(a) illustrates an analysis result of a substitution reaction in which a hydrogen atom on a —NH$_2$ surface is replaced with a chlorine atom. FIG. 16(b) illustrates an analysis result of a substitution reaction in which a hydrogen atom on a —NHCl surface is replaced with a chlorine atom. In FIG. 16A and FIG. 16B, the initial state (IS) is illustrated on the left, and the final state (FS) is illustrated on the right. As illustrated in FIG. 16A and FIG. 16B, the activation energy E$_{a6}$ of the substitution reaction in which the hydrogen atom on the —NH$_2$ surface is replaced with the chlorine atom and the activation energy E$_{a7}$ of the substitution reaction in which the hydrogen atom on the —NHCl surface is replaced with the chlorine atom are large at about 2 eV. Therefore, from the viewpoint of chlorinating the —NH$_2$ surface with a small activation energy, it is considered preferable to chlorinate the —NH$_2$ surface with a chlorine radical after radicalization with a hydrogen radical.

Figure 17A:
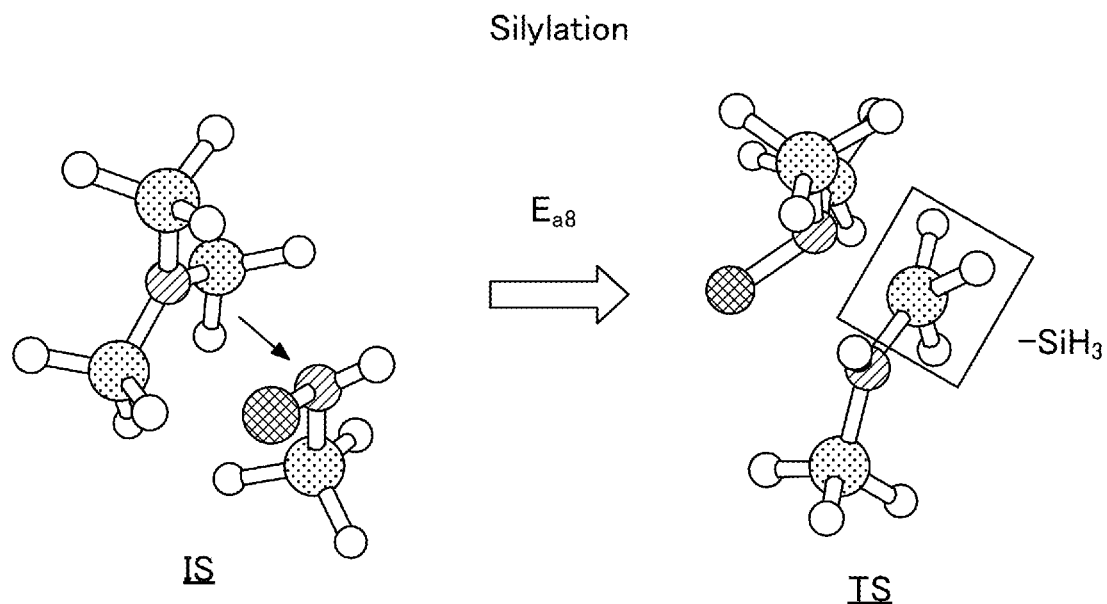
Figure 17B:
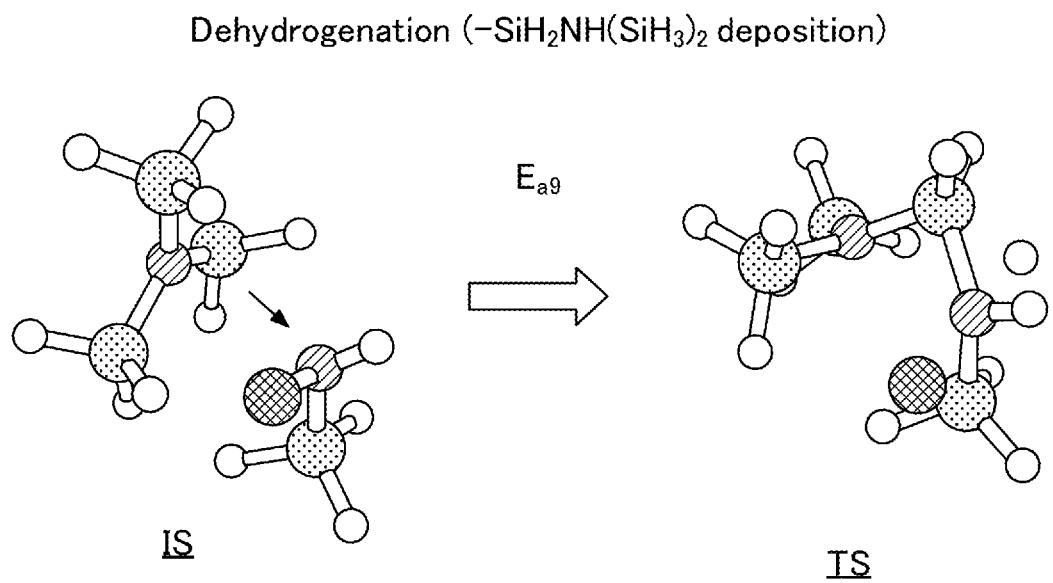

FIGS. 17A to 17C are diagrams illustrating a reaction of TSA to a chlorinated surface and illustrating an analysis result of a reaction of TSA to a —NHCl surface. FIG. 17A illustrates a silylation reaction, FIG. 17B illustrates a dehydrogenation reaction, and FIG. 17C illustrates an energy diagram. In FIG. 17A and FIG. 17B, the initial state (IS) is illustrated on the left, and the transition state (TS) is illustrated on the right. As illustrated in FIG. 17C, the ratio (E$_{a8}$/E$_{a9}$) of the activation energy E$_{a8}$ of the silylation reaction to the activation energy E$_{a9}$ of the dehydrogenation reaction is approximately 2.7. That is, the activation energy E$_{a9}$ of the dehydrogenation reaction is less than the activation energy E$_{a8}$ of the silylation reaction. Therefore, it is considered that the dehydrogenation reaction is the main reaction of the reaction of TSA to the chlorinated surface. As a result, relative to the silylation reaction to the —NH$_2$ surface in conventional, the deposition amount per reaction (the size of the adduct that binds to the nitrogen atom on the surface) increases.

Figure 18A:
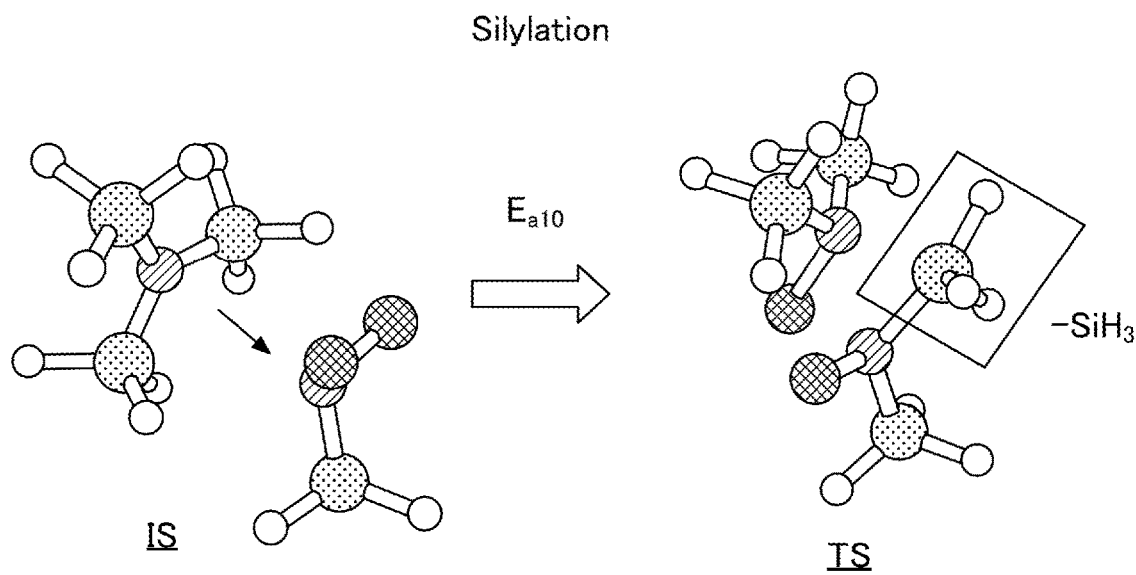
Figure 18B:
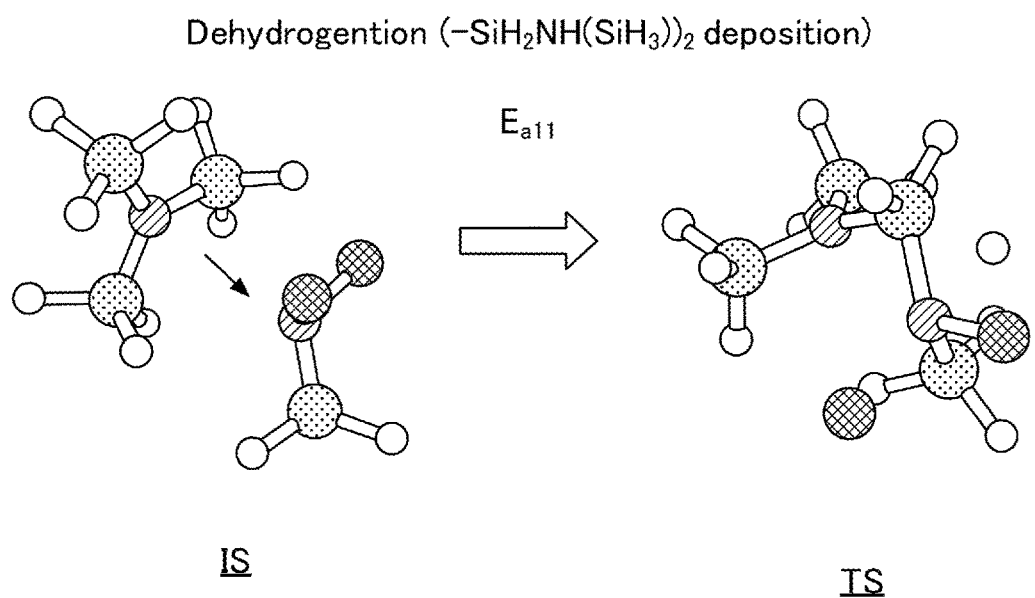

FIGS. 18A to 18C are diagrams illustrating a reaction of TSA to a chlorinated surface and illustrating an analysis result of a reaction of TSA to a —NCl$_2$ surface. FIG. 18A illustrates a silylation reaction, FIG. 18B illustrates a dehydrogenation reaction, and FIG. 18C illustrates an energy diagram. In FIG. 18A and FIG. 18B, the initial state (IS) is illustrated on the left, and the transition state (TS) is illustrated on the right. As illustrated in FIG. 18C, the ratio (E$_{a10}$/E$_{a11}$) of the activation energy E$_{a10}$ of the silylation reaction to the activation energy E$_{a11}$ of the dehydrogenation reaction is approximately 1.9. Thus, the activation energy E$_{a11}$ of the dehydrogenation reaction is less than the activation energy E$_{a10}$ of the silylation reaction. Therefore, it is considered that the dehydrogenation reaction is the main reaction of the reaction of TSA to the chlorinated surface. As a result, relative to the silylation reaction to the —NH$_2$ surface in conventional, the deposition amount per reaction (the size of the adduct that binds to the nitrogen atom on the surface) increases.

Figure 19A:
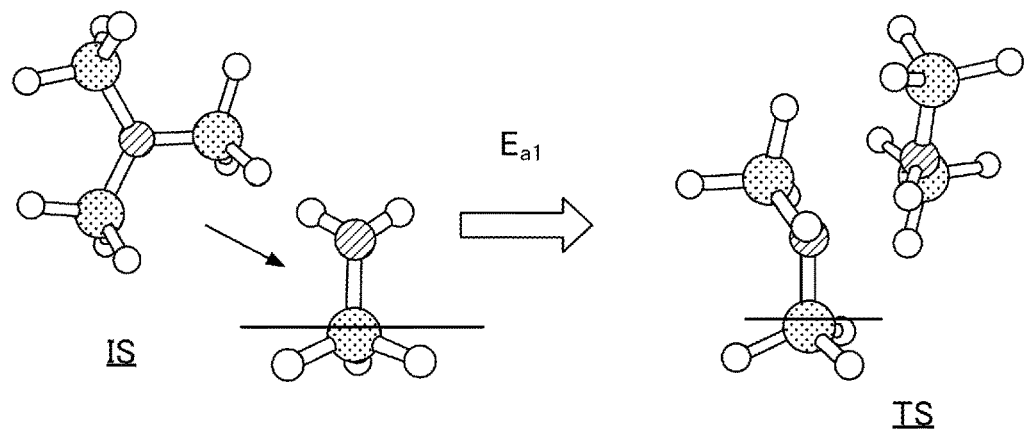
FIGS. 19A to 19C are diagrams comparing an activation energy of a reaction of TSA to each surface.
Figure 19B:
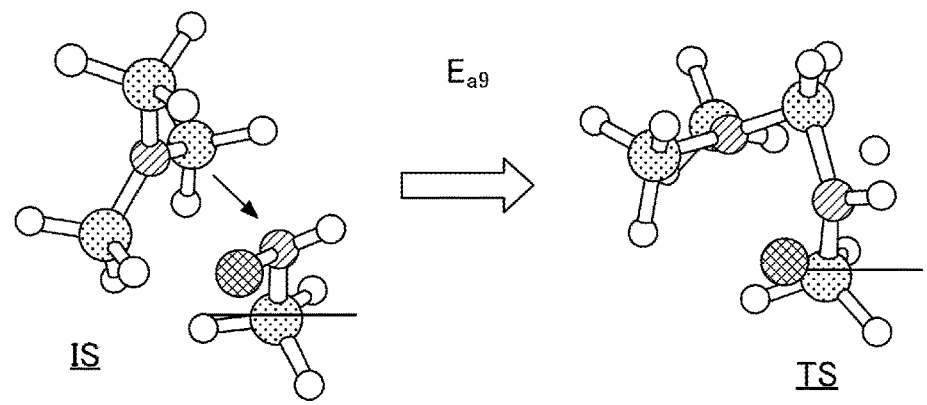
Figure 19C:
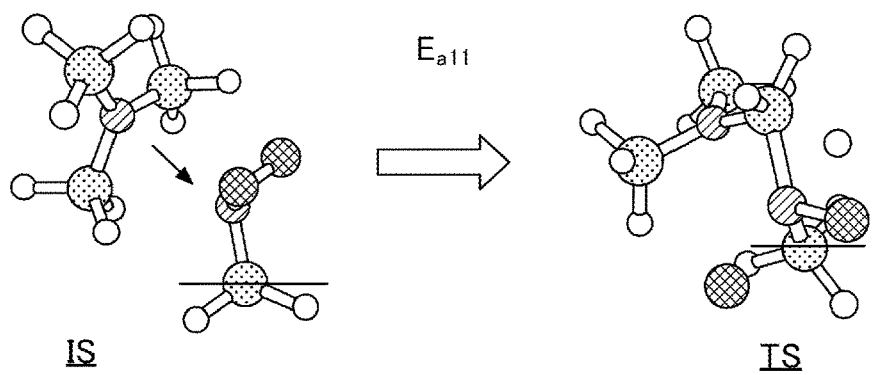

FIGS. 19A to 19C are diagrams comparing the activation energy of a reaction of TSA to each surface. FIG. 19A illustrates a silylation reaction of TSA to a —NH$_2$ surface, FIG. 19B illustrates a dehydrogenation reaction of TSA to a —NHCl surface, and FIG. 19C illustrates a dehydrogenation reaction of TSA to a —NCl$_2$ surface. In FIG. 19A to FIG. 19C, the initial state (IS) is illustrated on the left, and the transition state (TS) is illustrated on the right.

Figure 20:
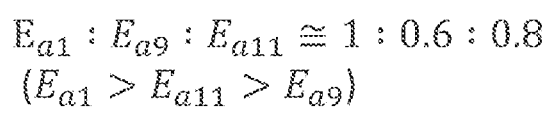

FIG. 20 is a diagram comparing the activation energy of a reaction of TSA to each surface and illustrating an analysis result of the ratio in the magnitude of the respective activation energies between the reaction of TSA to a —NH$_2$ surface, the reaction of TSA to a NHCl surface, and the reaction of TSA to a —NCl$_2$ surface. As illustrated in FIG. 20, the activation energies $E_{a1}$, $E_{a9}$, and $E_{a11}$ of the reactions of TSA to the —NH$_2$ surface, the NHCl surface, and the —NCl$_2$ surface satisfy the relationship of $E_{a1} > E_{a11} > E_{a9}$. From this analysis result, it can be seen that when the —NH$_2$ surface is chlorinated, the activation energy of the reaction of TSA is smaller than that of the hydrogenated surface.

Figure 21A:
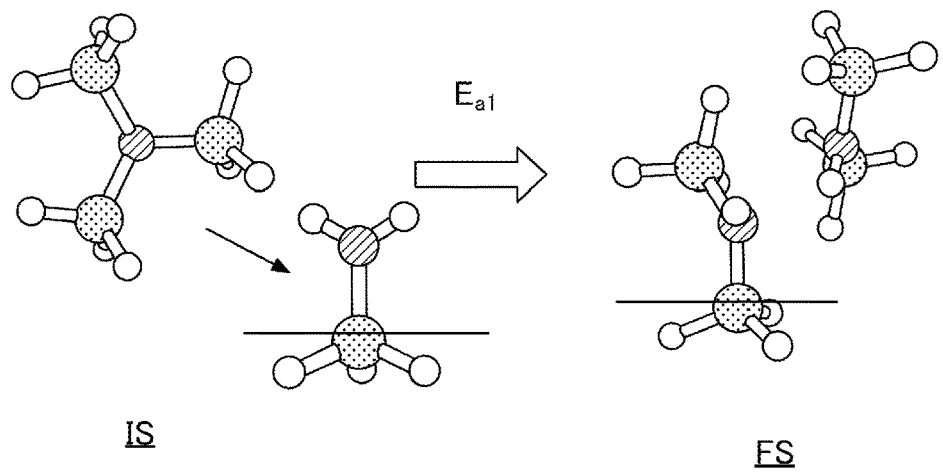
FIGS. 21A to 21C are diagrams comparing an energy of a final state of a reaction of TSA to each surface.
Figure 21B:
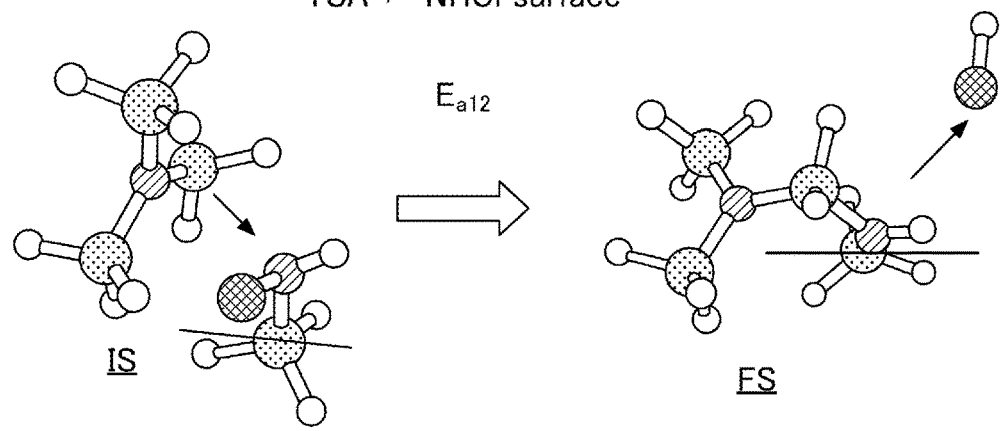
Figure 21C:
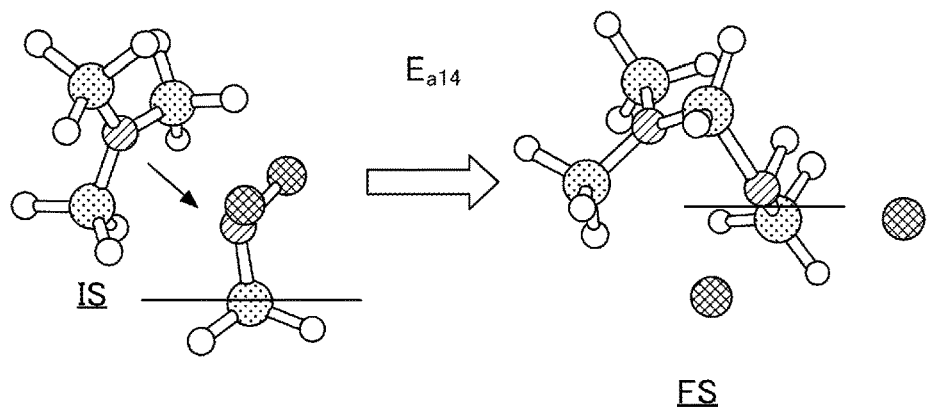

FIGS. 21A to 21C are diagrams comparing the energy of the final state (FS) of a reaction of TSA to each surface. FIG. 21A illustrates a silylation reaction of TSA to a —NH$_2$ surface. FIG. 21B illustrates a dehydrogenation reaction of TSA to a —NHCl surface. FIG. 21C illustrates a dehydrogenation reaction of TSA to a —NCl$_2$ surface. In FIG. 21A to FIG. 21C, the initial state (IS) is illustrated on the left, and the final state (FS) is illustrated on the right. As illustrated in FIG. 21A, in the reaction of TSA to the —NH$_2$ surface, the surface is silylated in the final state (FS). In contrast, as illustrated in FIG. 21B and FIG. 21C, on the chlorination surface (—NHCl surface, —NCl$_2$ surface) —SiH$_2$NH(SiH$_3$)$_2$, which is larger than the silyl group (—SiH$_3$), is bonded to the nitrogen atom (N) on the surface. Thus, the deposition amount per reaction increases. Thus, by chlorinating the NH$_2$ surface, the reaction path can be changed and the deposition amount per reaction can be increased.

Figure 22:
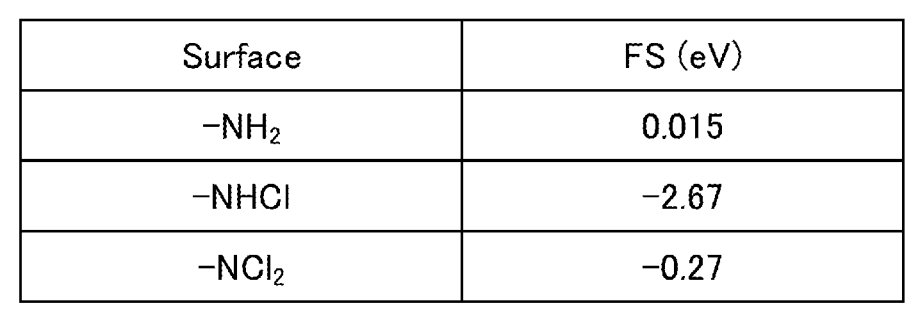

FIG. 22 is a diagram comparing the energy of the final state (FS) of the reaction of TSA to each surface (the —NH$_2$ surface, the —NHCl surface, and the —NCl$_2$ surface). As illustrated in FIG. 22, chlorinating the —NH$_2$ surface makes the energy of the final state smaller than the —NH$_2$ surface (hydrogenated surface), thus making the product more stable.

It should be noted that in the above described embodiment, NH$_3$ gas is an example of a nitriding gas and Cl$_2$ gas is an example of a process gas containing a halogen.

The embodiment disclosed herein should be considered to be exemplary in all respects and not restrictive. The above embodiment may be omitted, substituted, or modified in various forms without departing from the appended claims and spirit thereof.

Although the nitriding gas is NH$_3$ gas in the embodiment described above, the present disclosure is not limited to this. For example, an organohydrazine compound such as diazene (N$_2$H$_2$), hydrazine (N$_2$H$_4$), or monomethylhydrazine (CH$_3$(NH)NH$_2$) may be used as the nitriding gas.

Although the process gas containing a halogen is Cl$_2$ gas in the embodiment described above, the present disclosure is not limited to this. For example, bromine (Br$_2$) gas or iodine (I$_2$) gas may be used as the process gas containing a halogen.

In the above embodiment, the plasma processing apparatus has been described as a batch type apparatus that processes a plurality of substrates at once, but the present disclosure is not limited thereto. For example, the plasma processing apparatus may be a single-wafer type apparatus that processes substrates one by one. For example, the plasma processing apparatus may be a semi-batch type apparatus that revolves a plurality of substrates arranged on a rotation table in a process container by the rotation table, that causes the substrates to pass through an area to which a first gas is supplied and an area to which a second gas is supplied in order and, that processes the substrates.

What is claimed is:

1. A deposition method of depositing a silicon nitride film on a surface of a substrate, the deposition method comprising:
    (a) exposing the substrate to a plasma formed from a nitriding gas containing nitrogen (N) and hydrogen (H);
    (b) exposing the substrate to a plasma formed from hydrogen (H$_2$) gas;
    (c) exposing the substrate to a plasma formed from a process gas containing a halogen;
    (d) supplying trisilylamine (TSA) to the substrate; and
    (e) repeating (a) to (d) in this order.

2. The deposition method according to claim 1,
    wherein in (a), —NH$_2$ is generated on the surface of the substrate,
    wherein in (b), hydrogen (H) is extracted from the —NH$_2$ generated in (a),
    wherein in (c), a N—Cl bond is generated on the surface of the substrate, and
    wherein in (d), TSA is adsorbed on the surface of the substrate.

3. The deposition method according to claim 1, wherein (a) to (e) are performed at a temperature of 500° C. or less.

4. The deposition method according to claim 1, wherein the nitriding gas is ammonia (NH$_3$) gas.

5. The deposition method according to claim 1, wherein the process gas is chlorine (Cl$_2$) gas.

* * * * *